(12) United States Patent
Murakami

(10) Patent No.: US 6,861,656 B2
(45) Date of Patent: Mar. 1, 2005

(54) HIGH-LUMINOSITY EUV-SOURCE DEVICES FOR USE IN EXTREME ULTRAVIOLET (SOFT X-RAY) LITHOGRAPHY SYSTEMS AND OTHER EUV OPTICAL SYSTEMS

(75) Inventor: Katsuhiko Murakami, Sagamihara (JP)

(73) Assignee: Nikon Corporation, Tokyo (JP)

( * ) Notice: Subject to any disclaimer, the term of this patent is extended or adjusted under 35 U.S.C. 154(b) by 13 days.

(21) Appl. No.: 10/319,337

(22) Filed: Dec. 12, 2002

(65) Prior Publication Data

US 2003/0223544 A1 Dec. 4, 2003

(30) Foreign Application Priority Data

Dec. 13, 2001 (JP) ........................................ 2001-380646

(51) Int. Cl.⁷ .............................................. G21G 5/00
(52) U.S. Cl. .............................. 250/492.1; 250/504 R; 353/37; 355/67; 378/34
(58) Field of Search .......................... 250/492.1, 504 R; 353/37; 355/67; 378/34

(56) References Cited

U.S. PATENT DOCUMENTS

| | | |
|---|---|---|
| 5,002,348 A | 3/1991 | Wolf |
| 5,309,198 A * | 5/1994 | Nakagawa .................... 355/67 |
| 6,570,168 B1 | 5/2003 | Schultz et al. |

FOREIGN PATENT DOCUMENTS

| | | |
|---|---|---|
| DE | 199 35 568 A1 | 7/1999 |
| EP | 1 072 957 A2 | 1/2001 |
| JP | 2001-06840 | 3/2001 |

* cited by examiner

Primary Examiner—John R. Lee
Assistant Examiner—Paul M. Gurzo
(74) Attorney, Agent, or Firm—Klarquist Sparkman, LLP

(57) ABSTRACT

Devices and methods are disclosed that provide effective utilization of light beams produced from multiple EUV-light sources, especially such sources that have been bundled. An embodiment of an EUV-source device comprises multiple individual EUV-light sources each providing a respective point-light source of EUV radiation propagating as a respective beam from each point-light source. A reflective focusing-optical system is situated downstream of the EUV-light sources, and is configured to focus the beams from the point-light sources at a focus point. A variable-angle mirror is situated downstream of the focusing-optical system and is configured to reflect light of the respective beams from the point-light sources that has been reflected by the focusing-optical system. A mirror-tilting mechanism is coupled to the variable-angle mirror. The mechanism, when activated, tilts the mirror by a respective angle corresponding to the particular beam from one of the point-light sources that is incident on the mirror. This produces a composite beam propagating in a constant direction from the variable-angle mirror.

10 Claims, 9 Drawing Sheets

HIGH-LUMINOSITY EUV-SOURCE DEVICES FOR USE IN EXTREME ULTRAVIOLET (SOFT X-RAY) LITHOGRAPHY SYSTEMS AND OTHER EUV OPTICAL SYSTEMS

FIELD

This disclosure pertains to sources of "soft X-ray" (SXR; also termed "extreme ultraviolet" or EUV) light. This disclosure also pertains to optical systems that include such sources, and to apparatus and systems including such optical systems, such as EUV lithography (EUVL) systems, SXR microscopes, and SXR analysis apparatus.

BACKGROUND

In recent years, with the incessant demand for increasingly smaller active circuit elements in semiconductor integrated circuits and other microelectronic devices, there has been an urgent demand for projection-microlithography systems capable of achieving pattern transfer with increasingly greater resolution of fine circuit patterns. In this regard, the resolution limitations of optical (VUV) microlithography have become burdensome, resulting in an extensive current effort to develop a practical "next generation lithography" (NGL) system. Promising NGL approaches are directed to the use of wavelengths substantially shorter than VUV, namely the X-ray wavelengths.

An X-ray projection-microlithography system (i.e., an X-ray "transfer-exposure" apparatus) typically comprises an X-ray source, an illumination-optical system, a reticle stage (for holding a pattern-defining pattern to be transfer-exposed), an image-formation-optical (projection-optical) system, and a substrate stage (for holding a lithographic substrate such as a semiconductor wafer coated with a suitable "resist"). An especially large amount of expense and effort has been directed to the development of a practical SXR (EUV) microlithography system that utilizes an exposure wavelength in the range of 10–15 nm. These systems are known in the art as "EUVL" (EUV lithography) systems.

In the development of EUVL systems, particular attention has been directed to the development of a practical EUV light source. Originally synchrotron radiation (SR) sources were used. However, SR sources are extremely large and expensive and provide EUV light intensity that is too low for practical use in lithography. Hence, substantial effort currently is being directed to the development of laser-plasma EUV sources and discharge-plasma EUV sources. The currently required intensity from an EUV source is 50–150 W at a wavelength in the range of 13–14 nm and a bandwidth of 2% (approximately 0.3 nm). These sources are pulsatile, and the current exposure-control requirements demand a pulse frequency of 5 KHz or more for best exposure uniformity, etc.

Another important variable concerning an EUV source is "etendue," which is a product of the area of the light source and the solid angle of radiation from the source. Desirably, the etendue does not exceed the product of the area of the illumination region and the solid angle of the illumination beam. In an EUVL system the area of the illumination region as well as the solid angle of the illumination beam are smaller than the area and solid angle, respectively, of the illumination beam in a conventional optical microlithography system. Desirably, the etendue is approximately 1 mm$^2$ str or less. If etendue were allowed to increase above this limit, it theoretically would become impossible to guide such a beam to an illumination region.

In a discharge-plasma EUV source an electrode material or other substance ("target substance") is situated or placed in the vicinity of electrodes between which an electrical discharge is created. The discharge creates a plasma that, in the presence of the target substance, produces SXR radiation. An advantage of discharge-plasma EUV sources is simplicity and compactness of construction, compared to laser-plasma EUV sources and SR EUV sources. Also, the amount of SXR radiation emitted from a discharge-plasma EUV source is relatively large, due in part to the relatively high efficiency with which SXR radiation is produced per unit of electrical power consumed by the source. These sources also are low in cost. Discharge-plasma EUV sources can have any of various specific configurations currently under development, such as a "Z-pinch" configuration, a "capillary" configuration, and a "plasma-focus" configuration.

The maximum output from a discharge-plasma EUV source is limited mainly by the thermal-load limit of the source. In any of the configurations of discharge-plasma EUV sources listed above, a large electrical current passes between the electrodes and from the electrodes through the generated plasma. Since the electrodes and plasma have some electrical resistance, the large current produces substantial electrode heating. In addition, since the plasma is generated in the vicinity of the electrodes, heat from the plasma also is transmitted by irradiation to the electrodes, which further increases the heat load on the electrodes.

In order to reduce SXR absorption by gas in the vicinity of the plasma, discharge-plasma sources that generate SXR (EUV) wavelengths typically are enclosed in a chamber evacuated to a high vacuum. The vacuum environment in the chamber inhibits rapid dissipation of heat from the source by convection or thermal conduction. This inability to dissipate heat from the electrodes causes further heat accumulation in the electrodes.

Increases in electrode temperature are especially pronounced at high pulse frequencies of plasma generation. Under such conditions the temperature increase can be sufficiently high to melt the electrodes, rendering plasma (and thus EUV) generation impossible.

By limiting this type of thermal load on a discharge-plasma EUV source, the achievable EUV output from the source is limited to approximately 20–30 W, which is substantially less than the EUV output (50–150 W) required by an EUVL system.

A conventional manner of increasing the EUV output from the source involves "bundling" multiple individual discharge-plasma EUV sources 7, as shown in FIG. 1. However, as shown in FIG. 2, merely bundling multiple sources 7 in this manner increases the effective width of the collective light source to an extent that the etendue of EUV light produced by the bundled source is too large for effective utilization of the EUV beam from the source. FIG. 2(a) depicts an end view (axial view) of a single discharge-plasma EUV source 7, showing the light-emission portion 8. The diameter of the light-emission portion 8 (approximately 0.1 mm or less) is small compared to the outside diameter of the source 7 (approximately 10 mm or more). The etendue in this instance is determined by the solid angle of the downstream focusing optical system and the area of the light-emission portion 8.

In a bundled source, in contrast, the effective light-source area that determines etendue is not the sum of the areas of the individual light-emission portions, but rather the area of the smallest circle encompassing all of the individual light-emission portions of the respective individual sources. For example, in FIG. 2(b) four individual discharge-plasma EUV sources 7a–7d are bundled. The effective light-source area is the area of the circle 11 circumscribing all the individual light-emission portions 8a–8d. Hence, the etendue of the bundled source is substantially larger than of an individual constituent source of the bundle. As a result, with the conventional bundled source, the output of EUV light that actually can be used is insignificantly increased over that of an individual source.

SUMMARY

In view of the shortcomings of conventional discharge-plasma extreme ultraviolet (EUV, or SXR) sources as summarized above, the present invention provides, inter alia, EUV-source devices comprising multiple individual EUV-light sources that are bundled in a manner that substantially increases the usable quantity of light produced by the source device, compared to conventional bundled-source devices. Also provided are EUV lithography (EUVL) systems and methods utilizing such EUV-source devices.

According to a first aspect of the invention, EUV-source devices are provided. An embodiment of such a device comprises multiple individual EUV-light sources each providing a respective point-light source of EUV radiation propagating as a respective beam from each point-light source. The EUV-source device also includes a reflective focusing-optical system, a variable-angle mirror, and a mirror-tilting mechanism. The focusing-optical system is situated downstream of the EUV-light sources, and is configured to converge the beams from the point-light sources at a focus point. The variable-angle mirror desirably is a planar mirror and is situated downstream of the focusing-optical system and is configured to reflect light of the respective beams from the point-light sources that has been reflected by the focusing-optical system. The mirror-tilting mechanism, desirably a piezo-electric actuator, is coupled to the variable-angle mirror. The mirror-tilting mechanism is configured, when actuated, to tilt the mirror by a respective angle corresponding to the particular beam from one of the point-light sources that currently is incident on the variable-angle mirror. Thus, a composite beam of EUV light is produced that propagates in a constant direction from the variable-angle mirror.

The focus point desirably is situated on the surface of the variable-angle mirror. More desirably, the focus point is situated at a midpoint on the surface of the variable-angle mirror, wherein the midpoint is an intersection of X- and Y-tilt axes of the variable-angle mirror. The focus point can be situated upstream or downstream of the variable-angle mirror.

The individual EUV-light sources typically are bundled together. By way of example, the individual EUV-light sources are discharge-plasma sources or laser-plasma sources.

The EUV-source device further can comprise a controller connected to each of the EUV-light sources and to the mirror-tilting mechanism. The controller is configured to route respective control commands to the EUV-light sources and to the mirror-tilting mechanism so as to cause the EUV-light sources to produce the respective beams and to actuate the mirror-tilting mechanism in a controlled manner so as to contribute the respective beams to the composite beam. The controller also can be used to control production of pulsatile respective beams from the EUV-light sources and contribution of the respective beams to the composite beam such that the resultant pulses contributed to the composite beam do not overlap each other while producing a substantially continuous composite beam. Alternatively, the controller can be used to control production of pulsatile respective beams from the EUV-light sources and contribution of the respective beams to the composite beam such that respective time intervals are interposed between at least some of the pulses in the composite beam.

The EUV-source device further can comprise a respective planar mirror for each respective beam produced by the EUV-light sources. The planar mirrors are situated, between the focusing-optical system and the variable-angle mirror, along respective trajectories of the respective beams from the respective EUV-light sources. The planar mirrors are configured to reflect the respective beam to the variable-angle mirror.

Each of the respective beams from the EUV-light sources has a respective principal ray. The principal rays can be oriented in a manner such that they collectively define a cone having an axis of rotation and an apex representing an intersection point of the principal rays of the respective beams. The variable-angle mirror desirably is situated at the apex of the cone. In this configuration the composite beam reflected from the variable-angle mirror has a principal ray that is coaxial with the axis of rotation extending downstream of the variable-angle mirror.

If the individual EUV-light sources are bundled together, then each EUV-light source can be inclined relative to the optical axis of the focusing-optical system such that each respective beam provides its strongest light-emission intensity to the focus point.

Each respective beam from the EUV-light sources can be regarded as having a respective focus point and a respective principal ray. The respective principal rays desirably intersect each other at an intersection point, on the reflective surface of the variable-angle mirror, at which a principal ray of the composite beam intersects the reflective surface. In one configuration the respective focus points are situated, upstream of the variable-angle mirror, on a spherical surface that is concentric with the intersection point. This configuration further can comprise a respective planar mirror for each respective beam produced by the EUV-light sources. Each planar mirror is situated, upstream of the focus point of the respective beam from the respective EUV-light source, along the respective optical path of the respective beam from the respective EUV-light source and being configured to reflect the respective beam to the variable-angle mirror. In another configuration the respective focus points are situated, downstream of the variable-angle mirror, on a spherical surface that is concentric with the intersection point. This configuration further can comprise a respective planar mirror for each respective beam produced by the EUV-light sources. The planar mirrors are situated, between the focusing-optical system and the variable-angle mirror, along respective trajectories of the respective beams from the respective EUV-light sources and being configured to reflect the respective beam to the variable-angle mirror.

In another configuration each of the beams from the individual EUV-light sources has a respective propagation axis and a respective focus point. The focusing-optical system is shiftable in coordination with actuation of the EUV-light sources to direct the respective propagation axes to the focus point of the focusing-optical system such that all the respective focus points are coincident at the focus point of the focusing-optical system. The focus point of the focusing-optical system desirably is situated on the surface of the variable-angle mirror. This configuration further can comprise a focusing-system actuator coupled to the focusing-optical system so as to cause shifting of the focusing-optical system. A controller desirably is connected to each of the EUV-light sources and to the focusing-system actuator. The controller is configured to route respective control commands to the EUV-light sources and to the focusing-system actuator so as, in a controlled manner, to cause the EUV-light sources to produce the respective beams and to actuate the focusing-system actuator so as to contribute the respective beams to the composite beam.

The focusing-optical system can comprise a separate individual focusing-optical system associated with each respective EUV-light source.

A controller connected to each of the individual EUV-light sources can be configured to actuate the EUV-light sources in a controlled manner such that only one respective EUV-light source is producing its respective beam at a given instant in time.

Another aspect of the invention is directed to a combination of an EUV-optical system and an EUV-source device such as any of the configurations summarized above.

Another aspect of the invention is directed to an EUV-microlithography system that comprises an illumination-optical system, an EUV-source device, and a projection-optical system. The illumination-optical system is situated and configured to direct an EUV illumination beam to a pattern-defining reticle. The EUV-source device directs the illumination beam to the illumination-optical system, and can have any of the various configurations summarized above. The projection-optical system is situated downstream of the illumination-optical system, and is configured to form an image, of a region of the reticle illuminated by the illumination beam, on a corresponding region of a substrate.

According to yet another aspect of the invention, methods are provided for producing a beam of EUV radiation. An embodiment of such a method comprises a step in which respective beams of EUV light are produced from multiple selectively activatable EUV-light sources (the respective beams have respective principal rays). The method also includes the steps of directing the respective beams in a manner causing the respective principal rays to intersect each other at an intersection point and focusing each of the beams at a focus point. The method also includes the step of reflecting, at the intersection point, light of the respective beams from the focusing-optical system to form a composite beam propagating in a constant direction.

The reflecting step can comprise the step of providing a variable-angle mirror at the intersection point. Such a method includes the step of selectively tilting the variable angle mirror in coordination with the selective activation of the EUV-light sources so as to contribute each respective beam from an actuated EUV-light source to the composite beam propagating in the constant direction.

Each of the EUV-light sources typically produces respective pulses of EUV light. If so, then the producing step can comprise controlling activation of each of the EUV-light sources such that light pulses from multiple EUV-light sources are contributed to the composite beam in a manner in which the contributed pulses do not overlap each other. Alternatively or in addition, the producing step can comprise controlling activation of each of the EUV-light sources such that light pulses from multiple EUV-light sources are contributed to the composite beam in a manner in which selected time intervals are interposed between at least some of the contributed pulses in the composite beam.

The method further can comprise the step of preliminarily reflecting each of the respective beams from the EUV-light sources before reflecting the respective beams at the intersection point. This preliminary reflection step can comprise providing a respective planar mirror for each respective beam produced by the EUV-light sources, and placing the planar mirrors along respective trajectories of the respective beams, so as to reflect the respective beams to the intersection point.

The method further can comprise the step of orienting each EUV-light source relative to the intersection point so as to deliver a highest respective intensity of EUV light at the intersection point.

The directing step can comprise passing the respective beams from the EUV-light sources collectively through either a stationary or a "shiftable" focusing-optical system. Alternatively, the directing step can comprise passing the respective beams from the EUV-light sources through respective focusing-optical systems.

The method further can comprise the step of shifting the focusing-optical system as required to cause the respective principal rays of the respective beams from the EUV-light sources to intersect each other at the intersection point.

According to yet another aspect of the invention, methods are provided for reducing the etendue of an EUV-source device that forms an illumination beam from multiple EUV-light sources. An embodiment of such a method comprises producing respective beams of EUV light from multiple selectively activatable EUV-light sources (the respective beams have respective principal rays). The method includes the step of directing the respective beams in a manner causing the respective principal rays to intersect each other at an intersection point and focusing each of the beams at a focus point. The method also includes the step of reflecting, at the intersection point, light of the respective beams from the focusing-optical system to form a composite illumination beam propagating in a constant direction.

The foregoing and additional features and advantages of the invention will be more readily apparent from the following detailed description, which proceeds with reference to the accompanying drawings.

DETAILED DESCRIPTION

Figure 3:
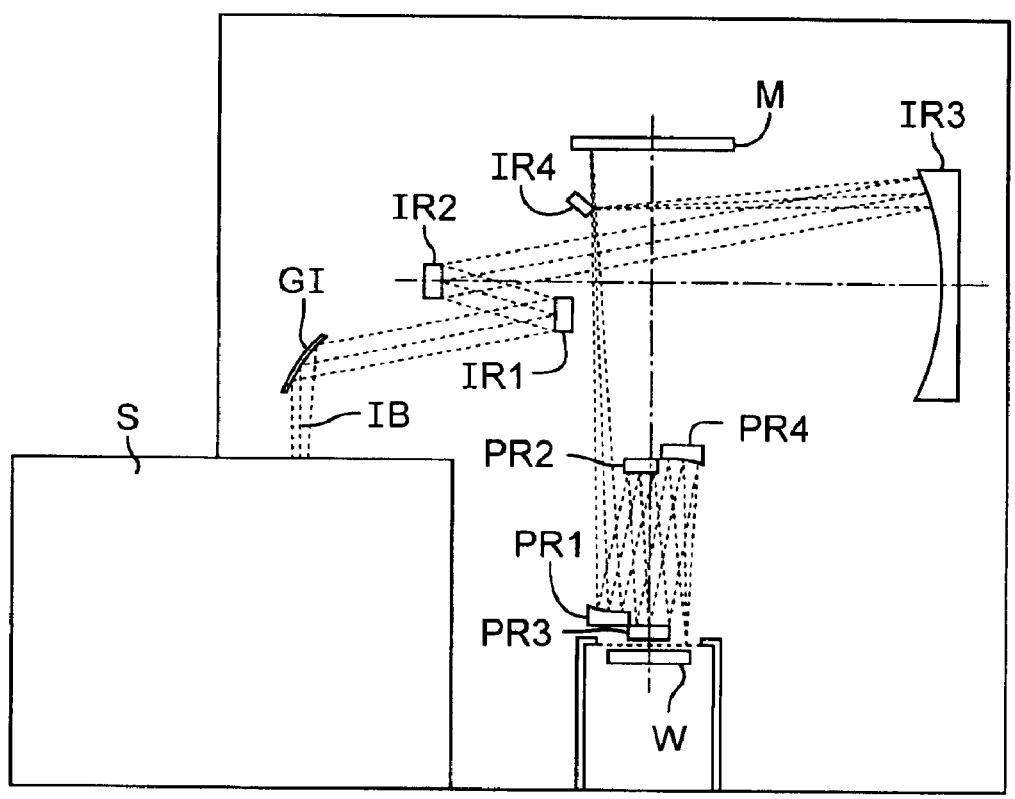
FIG. 3 is a schematic optical diagram of an EUV lithography (EUVL) system utilizing an EUV-source device according to any of various representative embodiments.

A schematic optical diagram of an embodiment of an X-ray microlithography system that utilizes a soft X-ray (SXR or EUV) source device S is shown in FIG. 3. The depicted system comprises the EUV-source device S, an illumination-optical system, a reticle stage (not shown but well-understood in the art) for holding a reticle M, a projection-optical system, and a substrate stage (not shown but well-understood in the art) for holding a substrate W (e.g., semiconductor wafer). The SXR-source apparatus generates an illumination beam IB of SXR (EUV) light.

The illumination beam IB propagates to the illumination-optical system comprising mirrors GI, IR1, IR2, IR3, IR4. The mirror GI usually is a grazing-incidence mirror that reflects the grazing-incident illumination beam IB from the source apparatus S. (Alternatively, the mirror GI can be a multilayer-film mirror.) The mirrors IR1, IR2, IR3, IR4 are multilayer-film mirrors each including a surficial multilayer film exhibiting high reflectivity to incident SXR radiation. The illumination-optical system also comprises a filter (not shown) that is transmissive only to SXR radiation of a prescribed wavelength. The illumination-optical system directs the illumination beam IB, having the desired wavelength, to a selected region on the reticle M.

Since there are no known materials that are transparent to SXR radiation of the desired wavelength, the reticle M must be a reflective reticle rather than a transmissive reticle as used for other lithography wavelengths.

The projection-optical system comprises multiple multilayer-film mirrors PR1, PR2, PR3, PR4 that collectively project an image of the illuminated portion of the reticle M onto a corresponding location on the substrate W. Thus, the pattern defined by the reticle M is transfer-exposed onto the substrate W. So as to be imprintable with the projected pattern, the substrate W is coated with an exposure-sensitive material termed a "resist." Since SXR radiation is absorbed and attenuated in the atmosphere, the optical trajectories from the source apparatus S to the substrate W must be in a suitable vacuum (e.g., $1 \times 10^{-5}$ Torr or less). Actual exposure of the substrate W can be performed in a "step-and-repeat," "scan-exposure," or other suitable manner, all of which involving controlled movements of the reticle stage and substrate state relative to each other as transfer-exposure of the pattern progresses. During exposure, the substrate W usually is situated in a separate chamber, termed a "substrate chamber" or "wafer chamber," that contains the substrate stage.

Figure 4:
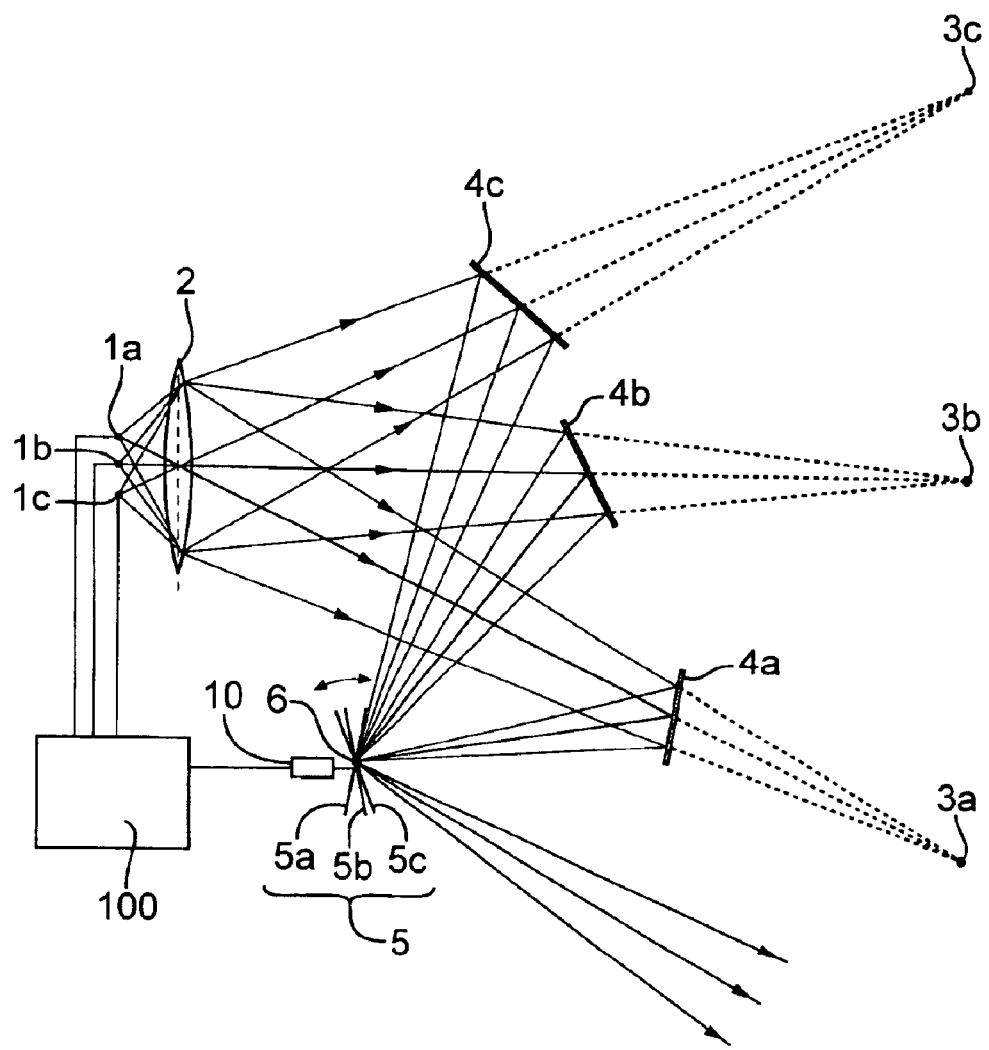
FIG. 4 is a schematic optical diagram of a first representative embodiment of an EUV-source device.

FIG. 4 depicts details of a first representative embodiment of an EUV-source device. Divergent rays of EUV radiation are generated from each of multiple point-light sources 1a–1c. The rays are converged by a focusing-optical system 2. (In FIG. 4, the focusing-optical system 2 is denoted by an image of a transparent lens; however, an actual focusing-optical system 2 is exemplified by any of the respective reflective-optical configurations shown in FIGS. 6(a)–6(c), discussed later below.) Since the respective positions of the point-light sources 1a–1c are different, the respective focus points 3a–3c of the point-light sources 1a–1c are at different respective positions. Respective planar mirrors 4a–4c are placed at respective positions, upstream of the respective focus points 3a–3c, at which the mirrors do not block rays of light from any other point-light source. The planar mirrors 4a–4c are oriented such that the rays from all the point-light sources 1a–1c (and reflected by the respective mirrors 4a–4c) converge at a single focus point 6.

Respective beams from each point-light source 1a–1c will propagate in different directions after passing through the focus point 6. By placing a variable-angle planar mirror 5 at the focus point 6 and tilting the mirror 5 (while maintaining the focus point 6 centered on the surface of the mirror 5), each incoming beam is made to propagate in the same direction downstream of the mirror 5. Thus, the beam downstream of the mirror 5 is a "composite" beam. In this regard, it is noted that the respective point-light sources 1a–1c do not emit light simultaneously, but rather sequentially. Hence, whenever the point-light source 1a is emitting light, the variable-angle mirror 5 is oriented at the angle 5a. Similarly, whenever the point-light source 1b is emitting light, the variable-angle mirror 5 is oriented at the angle 5b. Similarly, whenever the point-light source 1c is emitting light, the variable-angle mirror 5 is oriented at the angle 5c.

The point-light sources 1a–1c and a mechanism 10 effecting tilt of the variable-angle mirror 5 are connected electrically to a controller 100 that comprises control circuitry necessary to coordinate the production of light pulses by the point-light sources 1a–1c and corresponding actuation of the mirror-tilting mechanism 10. To control the timing of pulses of light emitted from a discharge-plasma source, electrical triggering can be employed to apply a controlled train of high-energy pulses to the electrodes. With a laser-plasma source, controlled timing can be achieved by controlling the emission of pulses from the excitation laser.

The actual illumination-light beam produced by an EUV-source device configured as described above is substantially continuous, and represents the summed respective pulsed outputs from multiple individual point-light sources. I.e., because the light output from each point-light source is a train of light pulses, the pulses from all the individual point-light sources are summed in a coordinated manner such that none of the light pulses overlaps any other light pulse. To such end, the mirror-tilting mechanism 10 tilts the variable-angle mirror 5 in a coordinated and synchronous manner to reflect, at the correct instant in time, each individual pulse produced by each individual point-light source. In other words, by actively shifting the mirror 5 in real time to the appropriate angle for each incoming light pulse from a respective point-light source, it is possible to sum the pulses from all the point-light sources and to cause the summed pulse train to propagate downstream of the mirror 5 along the same optical path, regardless of the specific point-light source actually emitting the pulse at a given instant. By combining the light pulses from multiple individual point-light sources in this manner, the resultant "composite" beam appears to diverge uniformly from a single focus point 6. Consequently, the etendue of the EUV-source device is effectively reduced, and the illumination-optical system can be configured to utilize the resulting combined light beam efficiently. I.e., the light reflected from the variable-angle mirror 5 in FIG. 4 corresponds to the illumination beam 1B that divergently propagates from the EUV-source device S to the illumination-optical system in FIG. 3.

Figure 1:
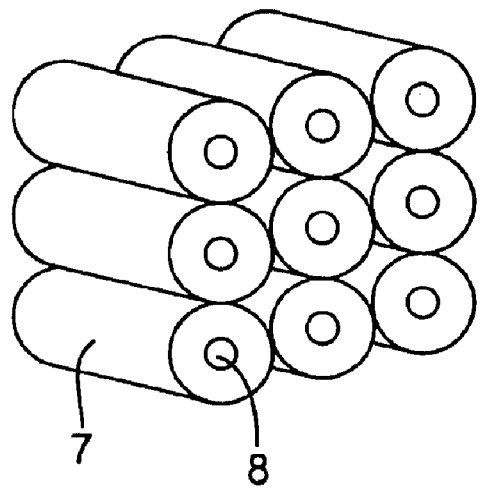
FIG. 1 is an oblique view of multiple (nine) individual EUV-light sources in a bundled configuration.
Figure 2A:
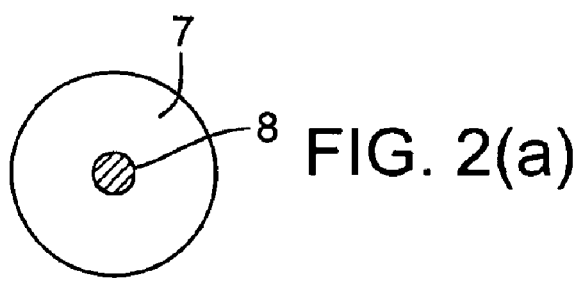
FIG. 2(a) is an end view of a single EUV-light source.
Figure 2B:
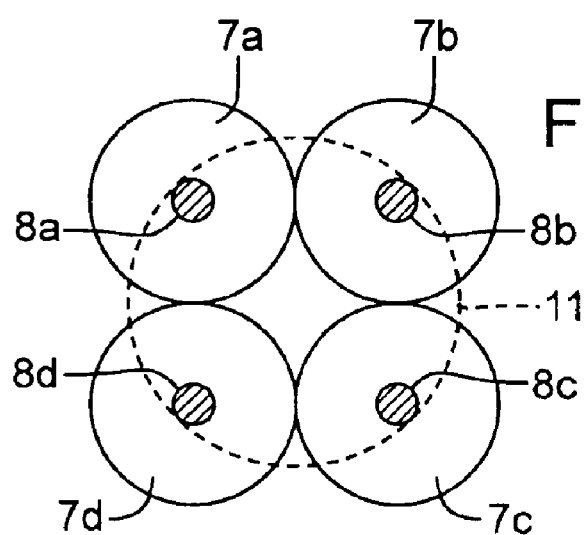
FIG. 2(b) is an end view of four EUV-light sources in a bundled configuration, as used for explaining the concept of "etendue."

Although FIG. 4 is necessarily two-dimensional for simplicity, it will be understood that the various point-light sources can be arranged in any of three dimensions relative to the focusing-optical system 2. In an exemplary embodiment, as shown in FIG. 1, nine Z-pinch discharge-plasma light sources 7 are bundled and used as respective point-light sources.

Figure 5:
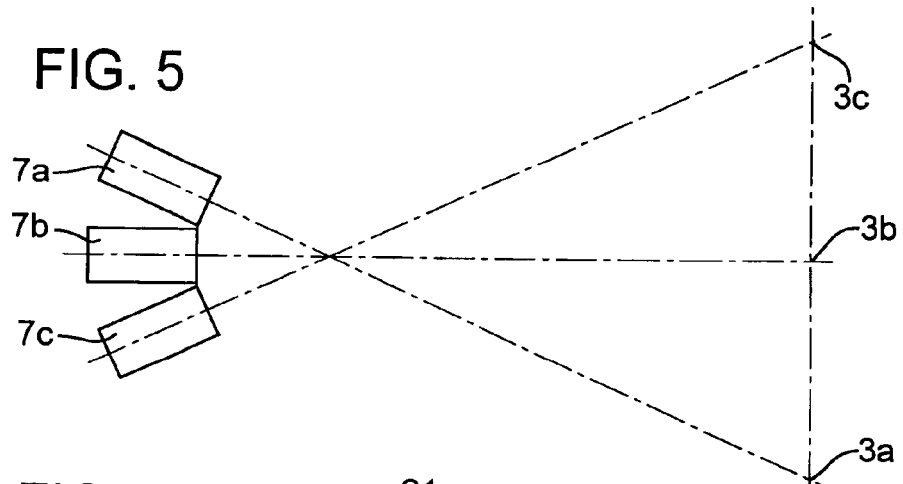
FIG. 5 is a schematic diagram illustrating a desirable manner of bundling multiple EUV-light sources as used in the first representative embodiment.

In general, there is an angular distribution to the emission intensity of light produced by a point-light source. Normally, the direction perpendicular to the light-emission portion 8 has the strongest light intensity. By tilting the respective individual EUV-light sources 7a–7c in the manner as shown in FIG. 5, the respective propagation directions of light from each source are aligned with the respective directions of the focus points 3a–3c from the focusing-optical system 2.

The reflective surfaces of the planar mirrors 4a–4c and of the variable-angle planar mirror 5 each comprise a surficial multilayer film coating configured to exhibit maximal reflection to incident EUV light. For example, if the incident EUV light has a wavelength of 13–14 nm, then the multilayer film comprises alternating layers of Mo and Si; if the incident EUV light has a wavelength of 11 nm, then the multilayer film comprises alternating layers of Mo and Be.

Note that reflectance from a multilayer-film mirror varies according to the angle of incidence of light on the mirror. This phenomenon can exist with the variable-angle planar mirror 5. Whenever reflectance varies in this manner, the intensity of light reflected from the mirror varies correspondingly, which can contribute to a fluctuation in the exposure dose. Hence, the angle of incidence of light to each of the planar mirrors 4a–4c desirably is substantially constant (within a range that satisfies specifications). If the angle of incidence of light from a particular point-light source 1a–1c cannot be held substantially constant, it is possible to impart an offsetting variation in the intensity of light actually emitted from the source. Alternatively, it is possible to control the reflectance of the respective planar mirrors 4a–4c or to use a filter to ensure that the respective intensity of each unit of light reflected from the variable-angle mirror 5 is substantially the same.

Figure 6A:
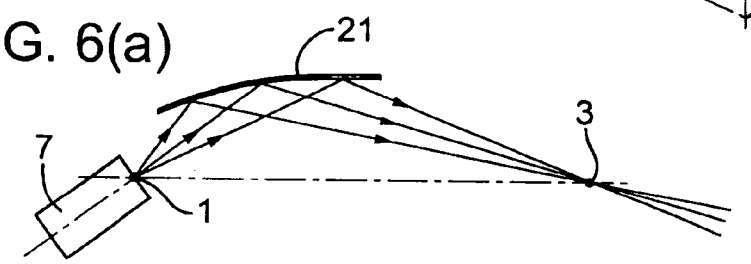
FIGS. 6(a)–6(c) are respective optical diagrams of respective embodiments of a focusing-optical system usable in any of various representative embodiments of an EUV-source device.
Figure 6B:
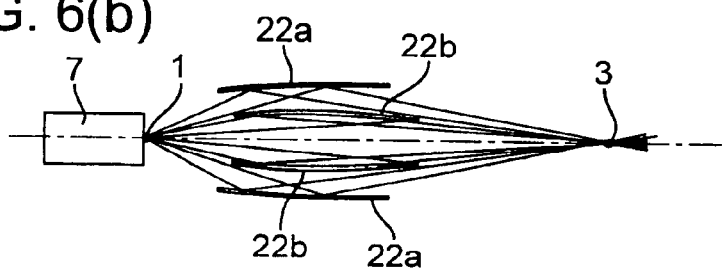
Figure 6C:
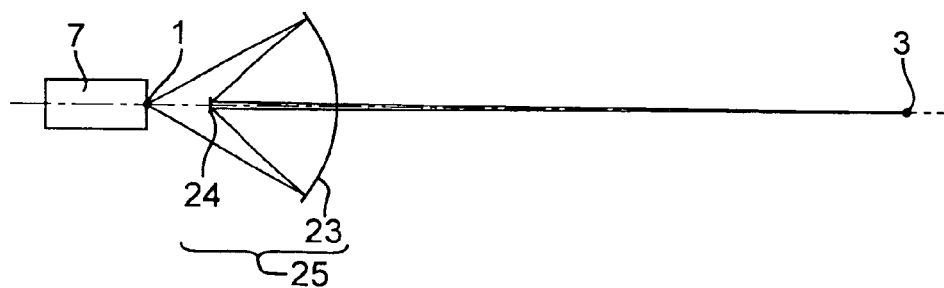

An exemplary embodiment of the focusing-optical system 2 of FIG. 4 is a reflection-optical system such as shown in any of FIGS. 6(a–6(c). In FIG. 6(a) a single mirror 21 having an ellipsoidal reflective surface is used to reflect light from multiple point-light sources (only one EUV source 7 is shown, providing a respective point-light source 1). By situating the point-light source 1 at one focus of the ellipse, the other focus of the ellipse is the focus point 3. In FIG. 6(b) multiple mirrors 22a, 22b (each having a respective ellipsoidal reflective surface such as the mirror shown in FIG. 6(a)) are used to reflect light from multiple point-light sources (only one EUV-light source is shown, providing a respective point-light source 1). With a mirror array such as shown in FIG. 6(b), the focusing solid angle from multiple point-light sources 1 can be made larger than the focusing angle obtainable with the configuration of FIG. 6(a). In FIG. 6(c) an optical system 25 is used that comprises a concave mirror 23 and a convex mirror 24. The concave mirror 23 has a central aperture for passing light reflected from the convex mirror 24. An optical system comprising such mirrors (having concentric spherical surfaces) is termed a "Schwarzchild" optical system. By using respective aspheric surfaces for the reflective surfaces of the mirrors 23, 24, the focusing solid angle from the point-light source 1 can be made even larger than the focusing solid angle realized from mirrors 23, 24 having spherical reflective surfaces.

Surficial coatings are used to achieve high reflectivity of EUV light from the surfaces of EUV-reflective mirrors such as any of the mirrors 21, 22a, 22b, 23, 24 used in the embodiments of FIGS. 6(a–6(c). The type and composition of a coating are selected according to the angle of incidence and the wavelength of incident light on the mirror. If the angle of incidence is approximately 10 degrees or less, total reflection is used, in which instance the coating comprises a thin metal film such as of Ru. If the angle of incidence is approximately 10 degrees or more, high reflectivity requires that a multilayer film be used. At λ=13–14 nm, a Mo/Si multilayer film is desirable. At λ=11 nm, a Mo/Be multilayer film is desirable. It also is possible to use a zone plate instead of the mirror. For many applications, an ellipsoidal mirror 21 having a surficial Mo/Si multilayer film, such as shown in FIG. 6(a), is used as the focusing-optical system 2.

In the embodiment of FIG. 4, a "DMD" (Digital Mirror Device, as known in the art) can be used for the variable-angle planar mirror 5 to achieve variability of the mirror angle with respect to the X- and Y-axes. A DMD is fabricated using conventional semiconductor-manufacturing technology, and multiple mirrors desirably are formed as a mirror array. Nevertheless, the number of mirrors can be as few as one.

Figure 7A:
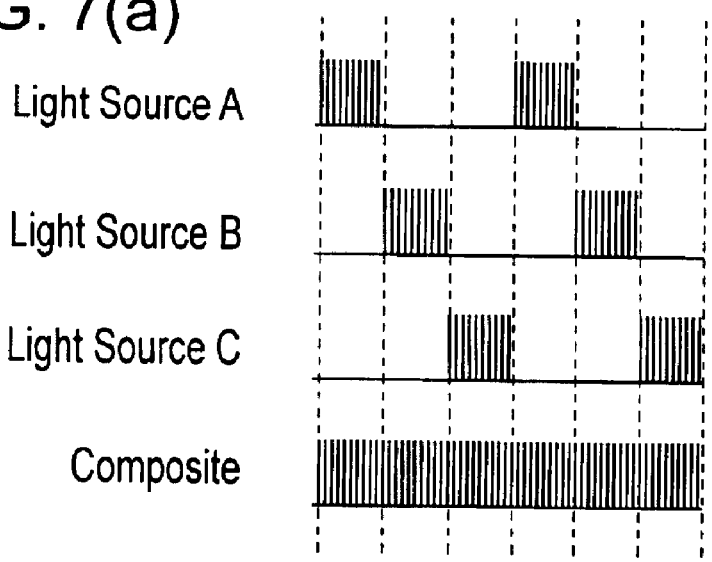
FIGS. 7(a)–7(b) are respective plots showing the formation of a composite beam from respective light-pulse trains from multiple respective EUV-light sources, as achieved by any of the various representative embodiments.

Exemplary light-production profiles of an EUV-source device, comprising multiple individual EUV-light sources, are shown in FIGS. 7(a–7(b). As noted above, a discharge-plasma light source emits EUV light in a pulsatile manner. In each of FIGS. 7(a–7(b) the abscissa is time and the ordinate is light-emission intensity. Light-emission pulses are shown from three individual EUV-light sources (Light Sources A, B, C). As a particular EUV-light source is producing a respective light pulse, the other EUV point-light sources are not producing respective pulses. By controlling the sequence of light-pulse production from each of the multiple EUV-light sources in this coordinated manner while simultaneously changing the angle of the variable-angle planar mirror 5 as required to reflect all the pulses along the same downstream optical path, the composite light "emission" from the focus point 6 is substantially continuous, as shown in FIG. 7(a). If only one EUV-light source were used and operated in a substantially continuous manner, according to conventional practice, there would be insufficient cooling time between the necessarily closely spaced successive pulses. In the scheme shown in FIG. 7(a), in contrast, adequate cooling time between successive pulses is provided for each of the individual EUV-light sources. Hence, each individual EUV-light source can be operated at higher power, yielding a composite beam having correspondingly greater intensity than achievable conventionally.

Figure 7B:
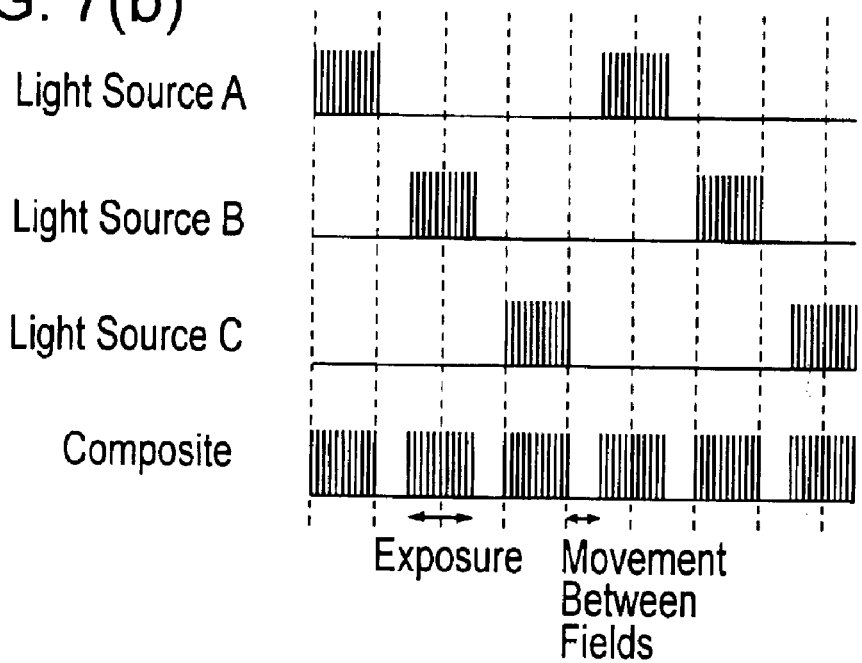

As indicated by the "composite" profile in FIG. 7(b), it is possible to produce a "substantially continuous" beam of EUV light that includes brief "off" intervals between each successive pulse in the composite beam. These intervals can be provided to accommodate, for example, corresponding intervals between angle shifts of the mirror 5. During these intervals, any of various other actions can be made, such as stage movements between successive exposure fields. In the case of scanning exposure, stage-step movements can be performed during respective intervals. Since exposure defects can arise during beam interruptions occurring during a scanning exposure, the intervals of light-production interruptions desirably occur before or after an exposure scan.

Providing adequate cooling time for the individual EUV-light sources and/or increasing exposure efficiency can be achieved for reasons other than a need to switch light beams between individual scans. For example, exposure light normally is unnecessary during stage movements between exposure fields, during detection of alignment marks, during certain calibrations, etc. These times may be used advantageously for changing the angle of the mirror 5 and/or switching to the next individual EUV-light source. These times also can be used for cooling the individual EUV-light sources. The resulting more efficient use of cooling periods allows the individual EUV-light sources to be operated at higher power than in instances in which exposure light is being produced continuously. The resulting greater light-emission intensity can yield a more efficient exposure.

Figure 8:
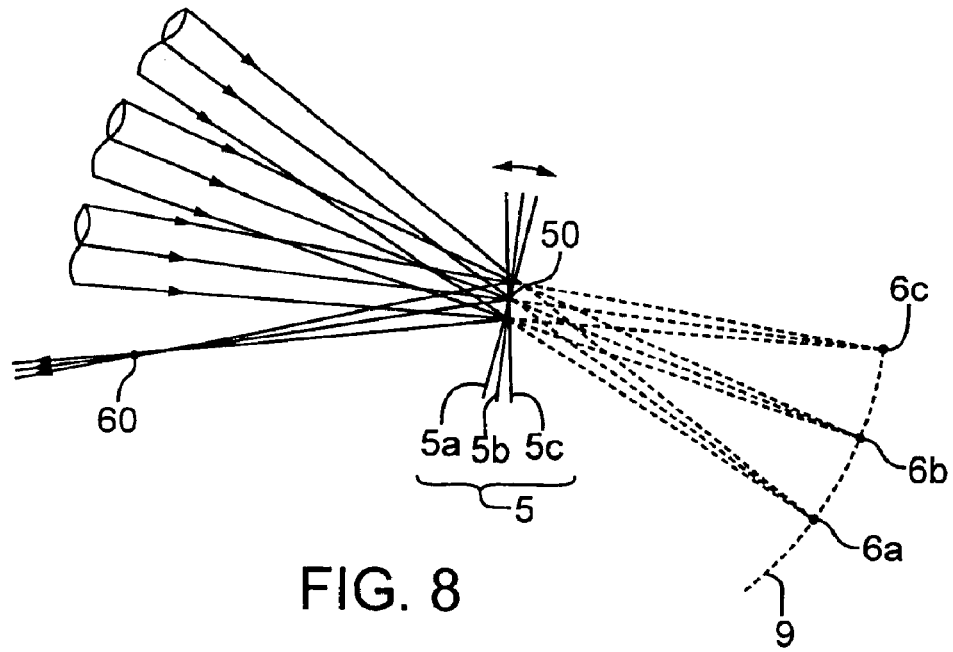
FIG. 8 is a schematic optical diagram of a second representative embodiment of an EUV-source device.

In the embodiment of FIG. 4, the variable-angle planar mirror 5 is situated at the focus point 6. In such an arrangement, because the full energy of the EUV light is concentrated locally on the surface of the mirror 5 surface, the multilayer film at the focus point 6 may heat excessively and become damaged. A second representative embodiment as illustrated in FIG. 8 avoids this potential problem. In FIG. 8, components that are similar to corresponding components of the first representative embodiment have the same respective reference numerals and are not described further.

Referring to FIG. 8, a variable-angle planar mirror 5 is situated at a location 50 upstream of the focus point 60. Respective beams from the individual EUV-light sources are "changed" by the mirror 5 at this location 50, by which is meant that the individual principal rays from each incident beam intersect each other at a single point at the location 50. Also, the respective cross-sections of the individual incident beams at this location 50 reveal that the individual beams are completely "stacked" on each other (fully overlap each other) at this location. (The cross-sectional area of a beam at this location 50 can vary slightly with incidence angle.) In this arrangement the individual planar mirrors 4a–4c (see FIG. 4) are located at respective positions (not shown, but located upstream of the mirror 5) that place the respective focus points 6a–6c of the individual beams from the EUV-light sources (if no mirror 5 were present) on a spherical surface 9 concentric with the location 50. In this arrangement, as the orientation angle of the planar mirror 5 changes according to the particular individual EUV-light source that is emitting light, the position of the focus point 60 remains constant. Thus, the outputs from multiple individual point-light sources 1a–1c are combined to form a "secondary source" of a beam of light that diverges from a single fixed focus point 6. This arrangement effectively reduces the etendue of the EUV-source device S.

FIG. 8 depicts the subject arrangement in a two-dimensional manner for simplicity. However, it will be understood that the individual EUV-light sources can be arranged in three dimensions. For example, in the exemplary embodiment shown in FIG. 1, nine hollow-cathode discharge-plasma light sources 7 are bundled and used as respective individual EUV-light sources.

In this embodiment, the focusing-optical system 2 can be configured as a mirror array providing multiple ellipsoidal surfaces, such as the mirrors 22a, 22b shown in FIG. 6(b). In such a configuration the "inner" mirrors 22b desirably have a thin film of Ru applied to their respective reflective surfaces, and the "outer" mirrors 22a desirably have a multilayer film of Mo and Si applied to their respective reflective surfaces. An exemplary mirror-tilting mechanism 10 (FIG. 4) is a piezo actuator mounted to the rear surface of the mirror 5. The mirror-tilting mechanism desirably is operable to tilt the variable-angle planar mirror 5 relative to the X- and Y-axes.

Figure 9:
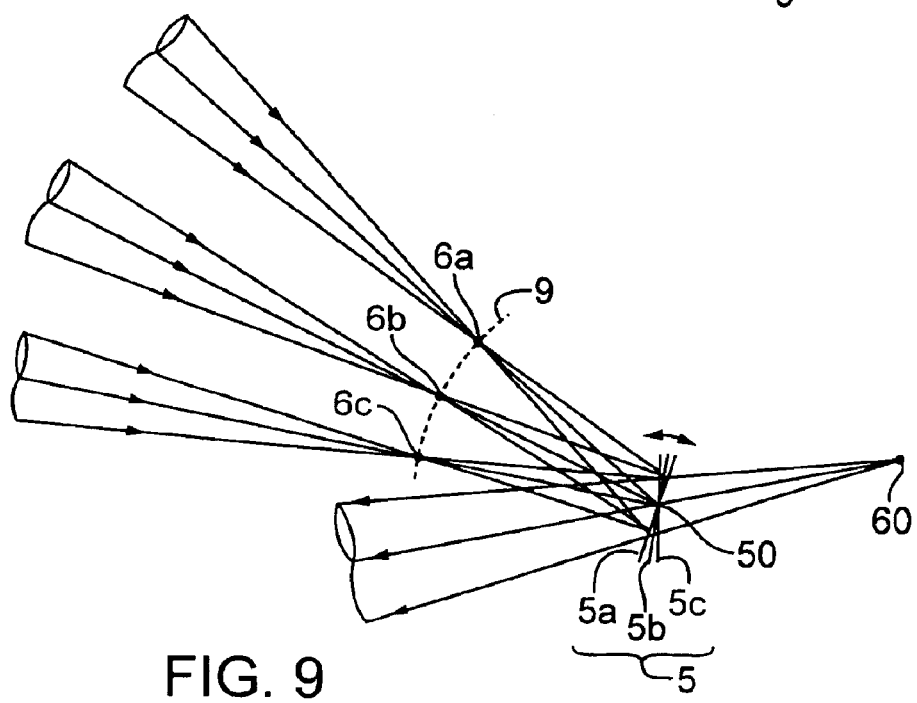
FIG. 9 is a schematic optical diagram of a third representative embodiment of an EUV-source device.

A third representative embodiment is depicted in FIG. 9, in which the variable-angle planar mirror 5 is situated downstream of the respective focus points 6a–6c of the individual EUV light beams, and upstream of the focus point 60. The mirror 5 is situated at a location at which the individual light beams from the respective EUV-light sources "change" (see above). The planar mirrors 4a–4c are situated (not shown, but located upstream of the focus points 6a–6c) so as to place the focus points 6a–6c on a spherical surface 9 that is concentric with the location 50 at which the individual light beams are changed. Thus, the position of the focus point 60 remains constant despite changes in the orientation angle of the mirror 5 (according to the particular EUV-light source that is producing light). With this configuration, the various point-light sources 1a–1c produce respective beams that divergently propagate in a fixed direction from a single focus point 6. Thus, the etendue of the EUV-source device is effectively reduced for use with an illumination-optical system.

FIG. 9 depicts the subject arrangement in a two-dimensional manner for simplicity. However, it will be understood that the individual EUV-light sources can be arranged in three dimensions. For example, in the exemplary embodiment shown in FIG. 1, nine capillary discharge-plasma light sources 7 are bundled and used as respective individual EUV-light sources.

In this embodiment, the focusing-optical system 2 can be configured as an optical system 25, such as that shown in FIG. 6(c), comprising two mirrors, one mirror 23 being concave and the other mirror 24 being convex. The convex surface desirably is spherical, and the concave surface desirably is aspherical. Both reflective surfaces desirably are coated with a Mo/Si multilayer film. The variable-angle planar mirror 5 desirably is actuated for tilting relative to the X- and Y-axes using a piezo actuator installed at the rear surface of the mirror.

Note that, in each of the embodiments described above, an example was described in which nine individual discharge-plasma light sources were bundled together. However, it will be understood that the actual number of individual EUV-light sources employed can be greater than or less than nine. As an alternative to discharge-plasma sources, laser-plasma light sources, SR sources, or other suitable light sources can be used.

In any of the embodiments described above, by combining individual light beams produced by multiple point-light sources such that the composite beam appears to originate from a single point, that point is regarded as a "secondary" EUV-light source.

Any of the foregoing embodiments can be used as an EUV-source device S for a SXR (EUV) microlithography system such as the system shown in FIG. 3. Light from the EUV-source device S is used as an illumination beam for illuminating a selected region on a reticle. Alternatively, light from the EUV-source device can be used for illuminating any of various other objects.

Figure 10:
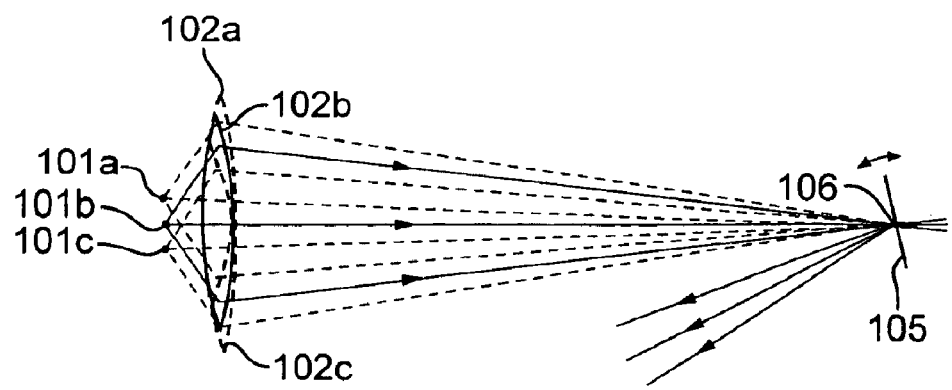
FIG. 10 is a schematic optical diagram of a fourth representative embodiment of an EUV-source device.

An EUV-source device according to the fourth representative embodiment is shown in FIG. 10, in which the operating conditions of the multiple individual EUV-light sources, the configuration of the focusing-optical system, and the configuration of the variable-angle planar mirror are similar to respective features in any of the first, second, and third embodiments. Also, as in the other embodiments described above, the individual EUV-light sources in the fourth representative embodiment are at respective angles relative to the axis of the focusing-optical system and arranged such that the directions in which light-emission intensity is strongest are used. Referring further to FIG. 10, divergent respective EUV light beams are generated from multiple individual point-light sources 101a–101c. These beams are converged by a focusing-optical system 102.

In FIG. 10 the focusing-optical system 102 is denoted for simplicity by a single transparent lens. However, it will be understood that the focusing-optical system 102 can have any of various configurations, including any of the reflective configurations shown in FIGS. 6(a–6(c).

Figure 11:
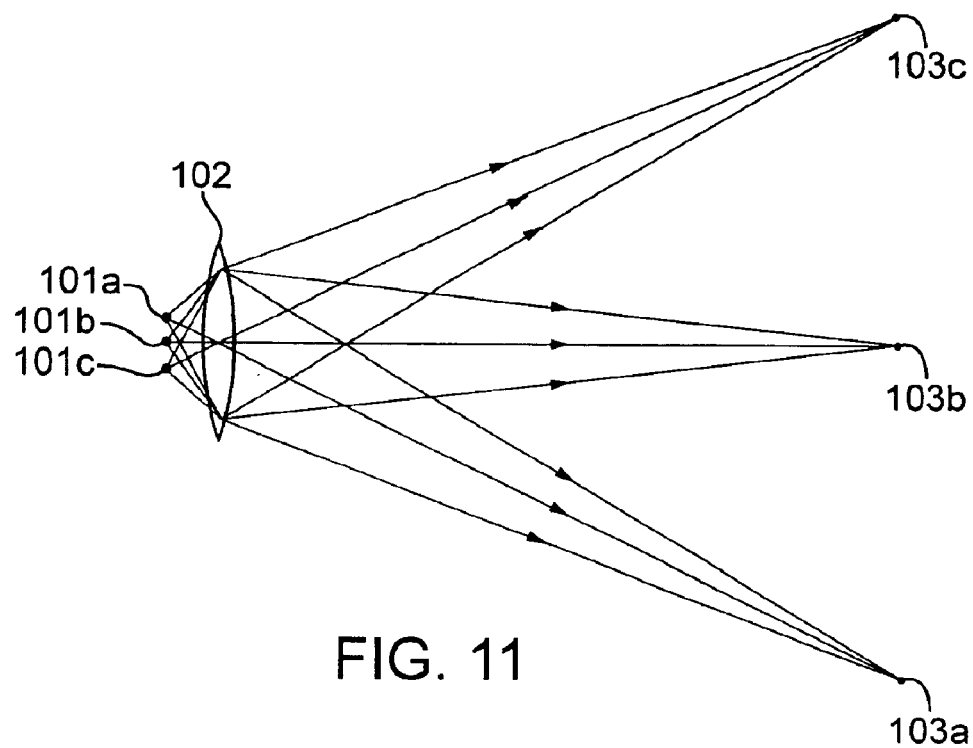
FIG. 11 is a schematic optical diagram showing, for comparison with FIG. 10, focusing achieved when tilting of the focusing-optical system is not performed in the fourth representative embodiment.

Referring further to the embodiment of FIG. 10, the individual point-light sources 101a–101c have different respective positions, as described above. As a result, as shown in FIG. 11, when individual respective beams from the point-light sources 101a–101c pass through a stationary focusing-optical system 102, the respective positions of the focus points 103a–103c are correspondingly different. In this embodiment, the focusing-optical system 102 comprises a drive mechanism that changes the position of the focusing-optical system 102 depending upon the particular point-light source 101a–101c that is emitting light at the current moment. For example, as shown in FIG. 10, whenever the point-light source 101a is emitting light, the focusing-optical system is shifted to the position 102a; whenever the point-light source 101b is emitting light, the focusing-optical system is shifted to the position 102b; and whenever the point-light source 101c is emitting light, the focusing-optical system is shifted to the position 102c. (The shift imparted to the focusing-optical system 102 actually is a limited rotational motion about the focus point 106.)

This motion of the focusing-optical system 102 can be effected by a tilting mechanism similar to the mirror-tilting mechanism 10 used in association with the variable-angle mirror 5 in the first representative embodiment. For example, the tilting mechanism can be a piezo-electric actuator that is actuated under control by a controller.

By making such coordinated shifts of the focusing-optical system 102, the position of the focal-point 106 remains constant for all the point-light sources 101a–101c. Since the respective light beams generated from the individual point-light sources 101a–101c propagate in different directions after passing through the focus point 106, a variable-angle planar mirror 105 is arranged at the location of the focus point 106. The direction of light reflected from the mirror 105 is kept uniform by tilting the mirror 105 about the focus point 106 (i.e., while keeping the focus point 106 positioned at the center of the reflective surface of the mirror 105).

As noted above, the individual point-light sources 101a–101c do not emit light simultaneously but rather sequentially. By adjusting the angle of the variable-angle planar mirror 105 according to the particular point-light source currently emitting light, the direction of light reflected from the mirror 105 is identical for all the point-light sources. Thus, the composite light from all the individual point-light sources 101a–101c is effectively a secondary light that propagates divergently in a uniform direction from the focus point 106. Because the etendue of the secondary light source is substantially reduced compared to conventional EUV-source devices, the light from the secondary source can be used highly efficiently with an illumination-optical system.

FIG. 10 depicts the subject arrangement in a two-dimensional manner for simplicity. However, it will be understood that the individual EUV-light sources can be arranged in three dimensions. For example, in the exemplary configuration shown in FIG. 12, four Z-pinch discharge-plasma EUV-light sources 107a–107d are bundled and used as respective point-light sources. Note that each EUV-light source 107a–107d can have its own focusing-optical system 102a–102d, respectively. The EUV-light sources 107a–107d desirably are equally spaced from one another on a circle 110, and tilted so as to be coaxial with the respective beams produced thereby.

Figure 12:
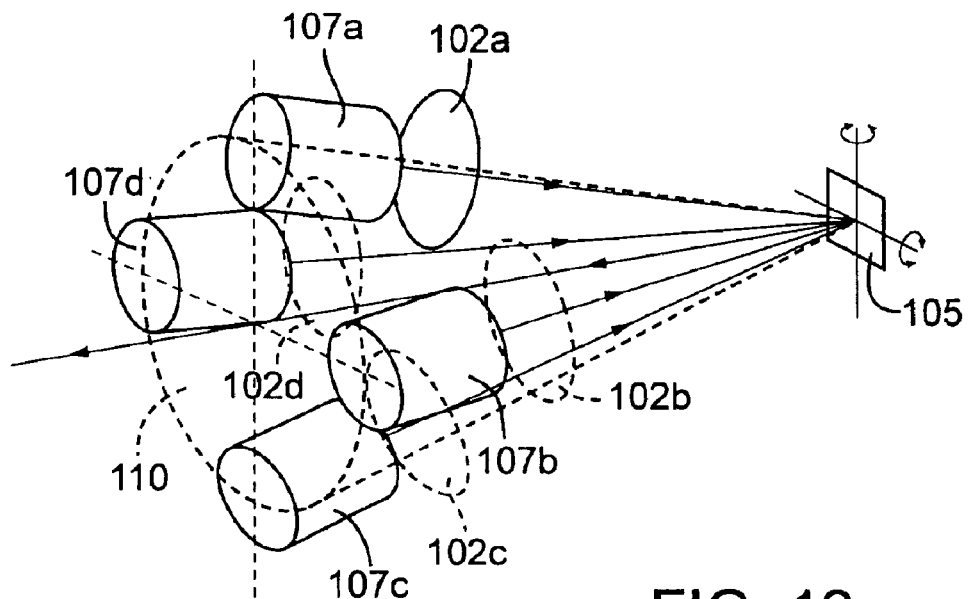
FIG. 12 is an oblique view of certain general aspects of focusing achieved by an EUV-source device according to any of the various representative embodiments.

The reflectance of a multilayer-film mirror varies according to the angle of incidence. Hence, the angle of incidence of rays incident to the variable-angle planar mirror 105 desirably changes only a small amount with each change of the individual point-light source 107a–107d currently delivering light to the mirror 105. To satisfy this criterion, as shown in FIG. 12, the locus of respective principal rays from each of the individual point-light sources 107a–107d defines a cone, wherein the principal rays converge on the apex of the cone. The variable-angle planar mirror 105 is situated at the apex of the cone, which is located at the intersection of both rotational axes of the mirror 105. Thus, all light reflected from the mirror 105 is from the intersection of the rotational axes of the mirror 105, and the angle of incidence of all rays to the variable-angle planar mirror 105 is the same regardless of the particular point-light source 107a–107d that currently is emitting light. This uniformity of the angle of incidence avoids changes in reflectance that otherwise would occur if the angle of incidence were changed from one point-light source to the next. (This technique also may be applied to any of the other embodiments described above.)

In this fourth embodiment, each focusing-optical system 102 can be, for example, a reflective system such as shown in any of FIGS. 6(a–6(c).

In the configuration shown in FIG. 10, the variable-angle planar mirror 105 is situated at the focus point 106. As discussed above, this configuration results in the concentration of high-energy EUV light at a single point on the surface of the mirror 105, which poses a risk of thermally damaging the multilayer film on the mirror 105 at the focus point 106. To avoid such damage, the mirror 105 can be placed upstream or downstream of the focus point, similar to the configurations shown in FIGS. 8 and 9, respectively.

Figure 13:
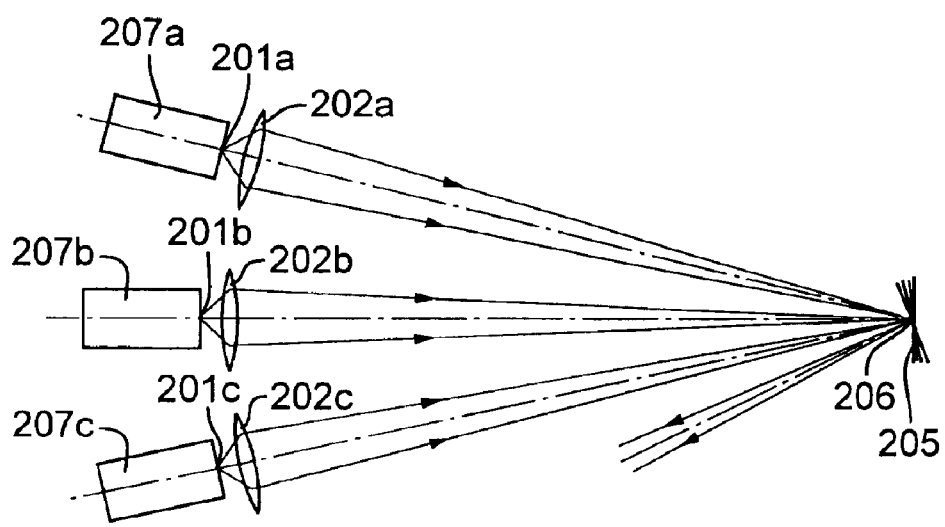
FIG. 13 is a schematic optical diagram of a fifth representative embodiment of an EUV-source device.

A fifth representative embodiment is shown in FIG. 13. The FIG. 13 embodiment is similar to certain of the embodiments described above, especially with respect to operation of the EUV-light sources, the configuration of the focusing-optical system, the configuration of the variable-angle mirror, the angling of the light sources, orientation of the light sources so as to utilize emitted light having the highest intensity, control of light production, etc. In this embodiment respective divergent light beams generated by multiple point-light sources 201a–201c (of respective EUV-light sources 207a–207c) are converged by respective focusing-optical systems 202a–202c.

In FIG. 13 each focusing-optical system 202a–202c is denoted for simplicity by a single respective transparent lens. However, it will be understood that the focusing-optical systems can have any of various configurations, including any of the reflective configurations shown in FIGS. 6(a–6(c).

The EUV-light sources 207a–207c and their respective focusing-optical systems 202a–202c desirably are arranged such that all the beams produced thereby converge at the single focus point 206. Each EUV-light source 207a–207c is regarded as providing a single respective point-light source 201a–201c. With such a configuration, the respective locations of the focus points from each point-light source 201a–201c are identical. Since the respective beams from the point-light sources 201a–201c propagate in different directions after passing through the focus point 206, a variable-angle planar mirror 205 is situated at the focus point 206. Thus, all light reflected from the mirror 205 reflects in the same direction by making appropriate changes in the orientation of the mirror 205 depending upon the particular light source 207a–207c producing light at the current moment. This change in orientation of the mirror 205 is made by tilting the mirror while maintaining the focus point 206 situated at the center of the mirror.

As noted above, the EUV-light sources 207a–207c do not emit light simultaneously but rather sequentially. By adjusting the angle of the variable-angle planar mirror 205 according to the particular EUV-light source that is emitting light, the direction of reflected light from the mirror 205 remains constant. As a result, light from all the point-light sources 201a–201c collectively becomes a "secondary" source of a light beam that divergently propagates from the focus point 206 in a uniform direction. Thus, the etendue of the EUV-source device is reduced, thereby allowing an illumination-optical system to utilize the light efficiently.

FIG. 13 depicts the subject arrangement in a two-dimensional manner for simplicity. However, it will be understood that the individual EUV-light sources can be arranged in three dimensions. For example, in the exemplary configuration shown in FIG. 12, four Z-pinch discharge-plasma light sources 107a–107d are bundled and used as respective EUV-light sources.

Figure 14A:
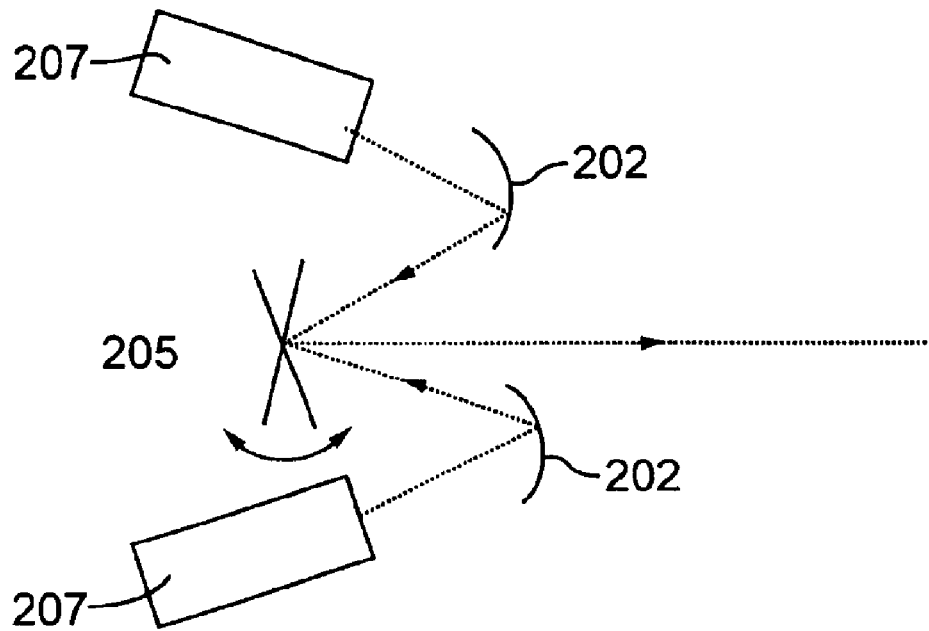
FIG. 14(a) is a schematic diagram showing operation of an exemplary focusing-optical system as used in the fifth representative embodiment.
Figure 14B:
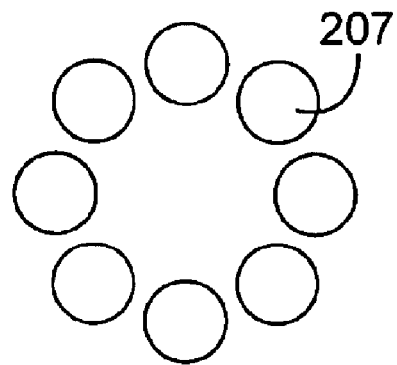
FIG. 14(b) is an end view of a bundle of eight EUV-light sources as used in the fifth representative embodiment.

In a configuration in which the focusing-optical system is a reflective system, an exemplary configuration for use with this embodiment is shown in FIGS. 14(a–14(b). In FIG. 14(b), eight EUV-light sources 207 are arranged in a circle. In FIG. 14(a), a variable-angle planar mirror 205 is situated at the center of the circle, from which illumination light propagates (to the right in the figure).

In this embodiment the variable-angle planar mirror 205 is situated at the focus point 206. As discussed above, this configuration results in the concentration of high-energy EUV light at a single point on the surface of the mirror 205, which poses a risk of thermally damaging the multilayer film on the mirror 205 at the focus point 206. To avoid such damage, the mirror 205 can be placed upstream or downstream of the focus point, similar to the configurations shown in FIGS. 8 and 9, respectively.

It will be understood that the number of individual EUV-light sources is not limited to, for example, the eight shown in FIG. 14(b). In any of the embodiments described herein, the actual number of EUV-light sources can be greater than or less than the specific number shown or described.

It also will be understood that this embodiment is not limited to use with discharge-plasma light sources. The embodiment alternatively can utilize laser-plasma light sources or SR sources, for example. This flexibility regarding the specific sources also is characteristic of the other embodiments described herein. The fifth representative embodiment, however, may allow a freer selection of various individual light sources than any of the first through fourth representative embodiments. This is because, in the fifth representative embodiment, each light source has its own focusing system. In other embodiments, the configurations of the light sources are more limited by the position of a focusing system serving all the light sources.

In any event, in any of these embodiments, multiple individual light sources are bundled without a corresponding increase in the etendue of the resulting secondary light source. This allows for more efficient utilization of illumination light produced by the EUV-source device than obtainable conventionally. Also, because the light from individual EUV-light sources can be combined by forming a coordinated pulse train of light collected from all the sources, adequate cooling time between pulses is provided to each individual EUV-light source. This allows each individual EUV-light source to be operated at higher power than would be permissible if continuous operation were imposed on the individual EUV-light sources.

Note that the word "point," as used for example in phrases such as "point-light sources" and "focus point" does not necessarily denote a true point (which is dimensionless). A "point" as used herein can have a practical dimension depending upon prevailing circumstances, and can range, for example, from several tens of $\mu$m to several hundreds of $\mu$m.

Whereas the invention has been described in the context of multiple representative embodiments, the invention is not limited to those embodiments. On the contrary, the invention is intended to encompass all modifications, alternatives, and equivalents as may be included within the spirit and scope of the invention, as defined in the appended claims.

What is claimed is:

1. A method for producing a beam of EUV radiation, the method comprising:

producing respective beams of EUV light from multiple selectively activatable EUV-light sources, the respective beams having respective principal rays;

directing the respective beams in a manner causing the respective principal rays to intersect each other at an intersection point and focusing each of the beams at a focus point using a focusing-optical system; and at the intersection point, reflecting light of the respective beams from the focusing-optical system to form a composite beam propagating in a constant direction.

2. The method of claim 1, wherein:

the reflecting step comprises providing a variable-angle mirror at the intersection point; and selectively tilting the variable-angle mirror in coordination with the selective activation of the EUV-light sources so as to contribute each respective beam from an actuated EUV-light source to the composite beam propagating in the constant direction.

3. The method of claim 1, wherein:

each of the EUV-light sources produces respective pulses of EUV light; and the producing step comprises controlling activation of each of the EUV-light sources such that light pulses from multiple EUV-light sources are contributed to the composite beam in a manner in which the contributed pulses do not overlap each other.

4. The method of claim 1, wherein:

each of the EUV-light sources produces respective pulses of EUV light; and the producing step comprises controlling activation of each of the EUV-light sources such that light pulses from multiple EUV-light sources are contributed to the composite beam in a manner in which selected time intervals are interposed between at least some of the contributed pulses in the composite beam.

5. The method of claim 1, further comprising the step of preliminarily reflecting each of the respective beams from the EUV-light sources before reflecting the respective beams at the intersection point.

6. The method of claim 5, wherein the preliminary reflection step comprises:

provding a respective planar mirror for each respective beam produced by the EUV-light sources; and placing the planar mirrors along respective trajectories of the respective beams, so as to reflect the respective beams to the intersection point.

7. The method of claim 1, further comprising orienting each EUV-light source relative to the intersection point so as to deliver a highest respective intensity of EUV light at the intersection point.

8. The method of claim 1, wherein the directing step comprises passing the respective beams from the EUV-light sources collectively through a stationary focusing-optical system.

9. The method of claim 8, further comprising the step of shifting the focusing-optical system as required to cause the respective principal rays of the respective beams from the EUV-light sources to intersect each other at the intersection point.

10. The method of claim 1, wherein the directing step comprises passing the respective beams from the EUV-light sources through respective focusing-optical systems.

* * * * *

UNITED STATES PATENT AND TRADEMARK OFFICE
CERTIFICATE OF CORRECTION

PATENT NO. : 6,861,656 B2
DATED : March 1, 2005
INVENTOR(S) : Murakami

It is certified that error appears in the above-identified patent and that said Letters Patent is hereby corrected as shown below:

<u>Column 15,</u>
Line 42, "FIGS. 14(a-14(b) " should be -- FIGS. 14(a)-14(b) --.

<u>Column 18,</u>
Line 16, add the following claims:

--11. An EUV-source device, comprising:
multiple individual EUV-light sources each providing a respective point-light source of EUV radiation propagating as a respective beam from each point-light source;
a reflective focusing-optical system situated downstream of the EUV-light sources, the focusing-optical system being configured to focus the beams from the point-light sources at a focus point;
a variable-angle mirror situated downstream of the focusing-optical system and configured to reflect light of the respective beams from the point-light sources that has been reflected by the focusing-optical system; and
a mirror-tilting mechanism coupled to the variable-angle mirror and configured, when actuated, to tilt the mirror by a respective angle corresponding to the particular beam from one of the point-light sources that currently is incident on the variable-angle mirror, thereby producing a composite beam of EUV light propagating in a constant direction from the variable-angle mirror.

12. The EUV-source device of claim 11, wherein the focus point is situated on the surface of the variable-angle mirror.

13. The EUV-source device of claim 11, wherein the focus point is situated at a midpoint on the surface of the variable-angle mirror, the midpoint being an intersection of X- and Y- tilt axes of the variable-angle mirror.

14. The EUV-source device of claim 11, wherein the focus point is situated upstream or downstream of the variable-angle mirror.

15. The EUV-source device of claim 11, wherein the variable-angle mirror is planar.

16. The EUV-source device of claim 11, wherein the individual EUV-light sources are bundled together.

17. The EUV-source device of claim 11, wherein the individual EUV-light sources are discharge-plasma sources.

18. The EUV-source device of claim 11, wherein the individual EUV-light sources are laser-plasma sources.

19. The EUV-source device of claim 11, wherein the mirror-tilting mechanism comprises a piezo-electric positioning device.

UNITED STATES PATENT AND TRADEMARK OFFICE
CERTIFICATE OF CORRECTION

PATENT NO. : 6,861,656 B2
DATED : March 1, 2005
INVENTOR(S) : Murakami

It is certified that error appears in the above-identified patent and that said Letters Patent is hereby corrected as shown below:

Column 18 (cont'd),

20. The EUV-source device of claim 11, further comprising a controller connected to each of the EUV-light sources and to the mirror-tilting mechanism, the controller being configured to route respective control commands to the EUV-light sources and to the mirror-tilting mechanism so as, in a controlled manner, to cause the EUV-light sources to produce the respective beams and to actuate the mirror-tilting mechanism so as to contribute the respective beams to the composite beam.

21. The EUV-source device of claim 20, wherein the controller controls production of pulsatile respective beams from the EUV-light sources and contribution of the respective beams to the composite beam such that the resultant pulses contributed to the composite beam do not overlap each other while producing a substantially continuous composite beam.

22. The EUV-source device of claim 20, wherein the controller controls production of pulsatile respective beams from the EUV-light sources and contribution of the respective beams to the composite beam such that respective time intervals are interposed between at least some of the pulses in the composite beam.

23. The EUV-source device of claim 11, further comprising a respective planar mirror for each respective beam produced by the EUV-light sources, the planar mirrors being situated, between the focusing-optical system and the variable-angle mirror, along respective trajectories of the respective beams from the respective EUV-light sources and being configured to reflect the respective beam to the variable-angle mirror.

24. The EUV-source device of claim 11, wherein:
each of the respective beams from the EUV-light sources has a respective principal ray;
the principal rays collectively define a cone having an axis of rotation and an apex representing an intersection point of the principal rays of the respective beams;
the variable-angle mirror is situated at the apex; and
the composite beam reflected from the variable-angle mirror has a principal ray that is coaxial with the axis of rotation extending downstream of the variable-angle mirror.

25. The EUV-source device of claim 11, wherein:
the focusing-optical system has an optical axis;
the individual EUV-light sources are bundled together; and
each EUV-light source is inclined relative to the optical axis of the focusing-optical system such that each respective beam provides its strongest light-emission intensity to the focus point.

UNITED STATES PATENT AND TRADEMARK OFFICE
CERTIFICATE OF CORRECTION

PATENT NO.     : 6,861,656 B2
DATED          : March 1, 2005
INVENTOR(S)    : Murakami It is certified that error appears in the above-identified patent and that said Letters Patent is hereby corrected as shown below:

Column 18 (cont'd),

26. The EUV-source device of claim 11, wherein:
each respective beam from the EUV-light sources has a respective focus point and a respective principal ray;
the respective principal rays intersect each other at an intersection point, on the reflective surface of the variable-angle mirror, at which a principal ray of the composite beam intersects the reflective surface; and
the respective focus points are situated, upstream of the variable-angle mirror, on a spherical surface that is concentric with the intersection point.

27. The EUV-source device of claim 26, further comprising a respective planar mirror for each respective beam produced by the EUV-light sources, each planar mirror being situated, upstream of the focus point of the respective beam from the respective EUV-light source, along the respective optical path of the respective beam from the respective EUV-light source and being configured to reflect the respective beam to the variable-angle mirror.

28. The EUV-source device of claim 11, wherein:
each respective beam from the EUV-light sources has a respective focus point and a respective principal ray;
the respective principal rays intersect each other at an intersection point, on the reflective surface of the variable-angle mirror, at which a principal ray of the composite beam intersects the reflective surface; and
the respective focus points are situated, downstream of the variable-angle mirror, on a spherical surface that is concentric with the intersection point.

29. The EUV-source device of claim 28, further comprising a respective planar mirror for each respective beam produced by the EUV-light sources, the planar mirrors being situated, between the focusing-optical system and the variable-angle mirror, along respective trajectories of the respective beams from the respective EUV-light sources and being configured to reflect the respective beam to the variable-angle mirror.

30. The EUV-source device of claim 11, wherein:
each of the respective beams from the individual EUV-light sources has a respective propagation axis and a respective focus point; and
the focusing-optical system is shiftable in coordination with actuation of the EUV-light sources to direct the respective propagation axes to the focus point of the focusing-optical system such that all the respective focus points are coincident at the focus point of the focusing-optical system.

31. The EUV-source device of claim 30, wherein the focus point of the focusing-optical system is situated on the surface of the variable-angle mirror.

UNITED STATES PATENT AND TRADEMARK OFFICE
CERTIFICATE OF CORRECTION

PATENT NO.    : 6,861,656 B2
DATED         : March 1, 2005
INVENTOR(S)   : Murakami It is certified that error appears in the above-identified patent and that said Letters Patent is hereby corrected as shown below:

Column 18 (cont'd),

32. The EUV-source device of claim 30, further comprising:
a focusing-system actuator coupled to the focusing-optical system so as to cause shifting of the focusing-optical system; and
a controller connected to each of the EUV-light sources and to the focusing-system actuator, the controller being configured to route respective control commands to the EUV-light sources and to the focusing-system actuator so as, in a controlled manner, to cause the EUV-light sources to produce the respective beams and to actuate the focusing-system actuator so as to contribute the respective beams to the composite beam.

33. The EUV-source device of claim 11, wherein the focusing-optical system comprises a separate individual focusing-optical system associated with each respective EUV-light source.

34. The EUV-source device of claim 11, further comprising a controller connected to each of the individual EUV-light sources, the controller being configured to actuate the EUV-light sources in a controlled manner such that only one respective EUV-light source is producing its respective beam at a given instant in time.

35. A method for reducing the etendue of an EUV-source device that forms an illumination beam from multiple EUV-light sources, the method comprising:
producing respective beams of EUV light from multiple selectively activatable EUV-light sources, the respective beams having respective principal rays;
directing the respective beams in a manner causing the respective principal rays to intersect each other at an intersection point and focusing each of the beams at a focus point; and
at the intersection point, reflecting light of the respective beams from the focusing-optical system to form a composite illumination beam propagating in a constant direction.--

Signed and Sealed this

Thirty-first Day of May, 2005

JON W. DUDAS
*Director of the United States Patent and Trademark Office*